(12) United States Patent
Le Guet et al.

(10) Patent No.: US 7,568,875 B2
(45) Date of Patent: Aug. 4, 2009

(54) VACUUM INTERFACE BETWEEN A MINI-ENVIRONMENT POD AND A PIECE OF EQUIPMENT

(75) Inventors: Catherine Le Guet, La Motte-Servolex (FR); Jean-Pierre Desbiolles, Cruseilles (FR); Hisanori Kambara, Villy-le-Pelloux (FR); Erwan Godot, Moncenis (FR); Raphael Sylvestre, Montmoison (FR)

(73) Assignee: Alcatel, Paris (FR)

( * ) Notice: Subject to any disclaimer, the term of this patent is extended or adjusted under 35 U.S.C. 154(b) by 364 days.

(21) Appl. No.: 11/212,841

(22) Filed: Aug. 29, 2005

(65) Prior Publication Data
US 2006/0102237 A1 May 18, 2006

(30) Foreign Application Priority Data
Aug. 30, 2004 (FR) .................................. 04 51932

(51) Int. Cl.
*H01L 21/00* (2006.01)
(52) U.S. Cl. ...................................... 414/411; 414/937
(58) Field of Classification Search ................. 414/217, 414/411, 416.03, 935, 939
See application file for complete search history.

(56) References Cited

U.S. PATENT DOCUMENTS

| 5,382,127 | A | | 1/1995 | Garric et al. |
| 5,772,386 | A | * | 6/1998 | Mages et al. ................. 414/411 |
| 6,105,782 | A | * | 8/2000 | Fujimori et al. ............. 206/710 |
| 6,123,120 | A | * | 9/2000 | Yotsumoto et al. ............ 141/65 |
| 6,261,044 | B1 | * | 7/2001 | Fosnight et al. ............. 414/217 |
| 6,302,927 | B1 | * | 10/2001 | Tanigawa .................... 29/25.01 |
| 6,883,539 | B2 | * | 4/2005 | Inoue et al. ............. 137/565.23 |
| 2001/0038783 | A1 | * | 11/2001 | Nakashima et al. ......... 414/217 |
| 2001/0041530 | A1 | | 11/2001 | Hara |
| 2003/0053894 | A1 | * | 3/2003 | Matsumoto .................. 414/217 |

FOREIGN PATENT DOCUMENTS

EP 1 204 138 A 5/2002

\* cited by examiner

*Primary Examiner*—Charles A Fox
(74) *Attorney, Agent, or Firm*—Sughrue Mion, PLLC

(57) ABSTRACT

In apparatus of the invention, a transport pod (1) can be coupled to an article-passing opening (11) of process equipment (9) in leaktight manner with sealing being provided by an interposed interface peripheral gasket (16). The pod door (4) can be secured selectively to the interface door (12) so that they can be moved together as a unit along an axial stroke followed by a transverse stroke under drive from door actuator means (14). The transport pod (1) is held by retaining means (15). The peripheral volume (21) around the two doors can be pumped out by means of a pump (22) and a duct (23). The pod door (4) can be locked on the transport door (1) by locking means (20) that guarantee good sealing while the transport pod (1) is separate from the process equipment (9). This ensures good sealing of the transport pod (1), and enables the doors (4, 12) to be opened under a vacuum without polluting the inside atmosphere.

21 Claims, 12 Drawing Sheets

VACUUM INTERFACE BETWEEN A MINI-ENVIRONMENT POD AND A PIECE OF EQUIPMENT

CROSS-REFERENCE TO RELATED APPLICATIONS

This application is based on French Patent Application No. 0451932 filed 30 Aug. 2004, the disclosure of which is hereby incorporated by reference thereto in its entirety, and the priority of which is hereby claimed under 35 U.S.C. §119.

BACKGROUND OF THE INVENTION

1. Field of the Invention

The present invention relates to transporting flat objects such as semiconductor wafers or masks between successive stages in a semiconductor fabrication process, the objects being transported in front-opening transport boxes, in particular in so-called front opening universal pods (FOUPs) that have a side opening, or in standard mechanical interface (SMIF) pods that have a bottom opening.

2. Description of the Prior Art

Wafers and masks are commonly transported in FOUP or SMIF pods in order to protect wafers and masks against the residual pollution that is present, even in "clean" rooms. The transport pod isolates the wafers and masks from the atmosphere that exists in a clean room.

In the processes that are presently the most commonly used, wafers and masks are transported in a FOUP type or SMIF type pod that can be opened after being coupled to an interface situated at the inlet to a piece of equipment. The transport pod remains at atmospheric pressure, and its internal atmosphere is air or nitrogen, likewise at atmospheric pressure.

An example of such a pod is described in the document US-2001/0041530 and EP-1 204 138. The transport pod comprises a leakproof peripheral wall with an inlet/outlet opening closable by a pod door having front sealing means and peripheral sealing means for keeping the zone for coupling with the interface isolated from the outside atmosphere.

The interface is a system enabling the transport pod to be positioned, the pod door to be opened, and a flat article to be held and transported so as to be transferred between the transport pod and the piece of equipment.

Usually, the equipment interface is itself provided with a robot for holding and moving flat articles between the transport pod and an evacuation chamber of the equipment. After passing into the interface, the flat article is transferred into the evacuation chamber of the equipment.

The evacuation chamber of the equipment is periodically put back to atmospheric pressure so as to be connected to the equipment interface for transferring flat articles. The evacuation chamber is likewise periodically evacuated so as to provide communication with a treatment chamber of the equipment for the purpose of transferring flat articles. These changes in gas pressure require both pumping operations and operations of returning to atmospheric pressure to be performed, and those operations take time and lead to gas flows. Such gas flows can move particles, thereby leading to particulate contamination of the flat articles. Furthermore, when the flat article is at atmospheric pressure, it can be subjected to contamination by molecules present in the atmosphere. The contamination may relate to the interface, the transport pod, or the flat articles.

In order to improve the isolation provided by the transport pod relative to the atmosphere, U.S. Pat. No. 5,382,127 has already proposed using transport pods in which the inside atmosphere is at a pressure that is higher than the outside atmosphere. That solution is not satisfactory, since for communication with a piece of equipment it remains necessary to apply pumping to the atmosphere into the transport pod, and that implies setting up a flow of gas which might lead to particulate contamination.

SUMMARY OF THE INVENTION

The invention seeks to avoid the drawbacks of the prior art by making it possible in particular to reduce very significantly the risks of contamination that result from pumping and returning to atmospheric pressure to which flat articles are periodically subjected in loading or interface chambers during operations of being transferred between a transport pod and a piece of equipment.

It is particularly important to limit any possible contamination in order to increase the productivity of semiconductor fabrication installations.

The invention also seeks to reduce treatment times in pieces of equipment by reducing the times required for pumping and degassing.

Finally, the invention seeks to simplify pieces of equipment by eliminating transfer chambers, where possible.

The essential idea on which the invention is based is to transport flat articles such as wafers or masks in a vacuum atmosphere that is as close to possible to the atmosphere present within a piece of equipment, and to couple transport pods and equipment by means that ensure permanent sealing against the external atmosphere in a clean room.

As a result, the transport pod is loaded and unloaded under a vacuum. This reduces constraints on the wafers or masks contained in the transport pod and transferred between the transport pod and the equipment.

Provision can thus be made for the transport pod to be provided with means for establishing or maintaining a vacuum during transport. Advantageously, the transport pod can be evacuated initially by a pumping system connected to the transfer interface on the equipment.

As a result, the transport pod becomes a movable load lock.

However a difficulty resides in opening the doors of the transport pod and of the interface in order to permit communication and the transfer of flat articles, while nevertheless maintaining sealing against the external atmosphere within the clean room.

Another difficulty lies in ensuring that the transport pod is itself sufficiently leaktight to maintain its inside atmosphere at low pressure for a sufficient length of time, time required not only for transport purposes, but also for periods of storage between successive stages in the processing of the flat article. In this respect, it might be thought that the difference between atmospheric pressure and the vacuum inside a transport pod would compress the sealing gaskets of a door sufficiently to ensure that it provides sufficiently leaktight closure of the transport pod during transport. However experience shows that such a solution is not reliable, in particular because sealing defects can be cumulative, a sealing defect leading to an increase in the pressure inside the transport pod, which in turn reduces the compression force on the sealing gaskets which then become less leaktight, thereby increasing the risk of leakage.

Another difficulty is that during periods when the transport pod is separate from the equipment, the outside faces of interface doors and of the transport pod are necessarily in contact with the less clean atmosphere that exists in the clean room. Polluting particles can thus become deposited on the outside faces of the doors. Thereafter, when sealing is established against the external atmosphere in a zone surrounding the doors, it is also necessary to avoid the outside surfaces of the door coming into contact with the inside atmosphere within the transport pod or the piece of equipment when they are put into communication by opening the doors. Particles deposited on the outside faces of the doors run the risk of escaping and polluting the atmosphere inside transport pods and pieces of equipment, and also of polluting the flat articles.

Another difficulty is also that any movement of mechanical parts such as latches, gaskets, or doors, can give rise to polluting particles being given off due to friction, which particles will then degrade the atmosphere inside transport pods and pieces of equipment, and also the flat articles for processing.

Another difficulty is to ensure that the transport pod and the interface are properly conditioned to avoid risks of contaminating the flat articles while they are being transferred between the transport pod and a piece of equipment. In particular, it is appropriate to avoid particles becoming deposited on the flat articles during transfer, and to avoid gas or moisture condensing on the flat articles.

The invention thus seeks to avoid all those drawbacks, so as to limit all types of contamination, in order to increase the productivity of semiconductor fabrication installations.

To achieve these objects, and others, the invention provides apparatus for transporting flat articles such as wafers or masks to or away from a piece of equipment, the apparatus comprising:

transport pods each having a leakproof peripheral wall with an inlet/outlet opening closable by a pod door and having pod door front sealing means;

at the inlet to the equipment, an interface provided with an article-passing opening closable by an interface door having interface door front sealing means;

peripheral sealing means for isolating from the external atmosphere a coupling zone between the front faces of the transport pod and of the interface around the article-passing opening and the inlet/outlet opening;

door actuator means fitted in the interface to move the pod door and the interface door between a closed position and an open position that is offset towards the inside of the interface; and pod door locking means provided in the transport pod that are actuatable by actuator means mounted in the interface selectively to lock and to unlock the pod door in the closed position in which it closes the inlet/outlet openings;

the apparatus being characterized in that it is for transporting articles under a low pressure atmosphere and in that it further comprises:

transport pods structured to withstand the external atmospheric pressure in the presence of a vacuum in their internal cavities;

pusher means adapted in the interface to apply axial thrust against the pod door towards the inside of the transport pod in order to compress the pod door front sealing means; and pod door front sealing means that are elastically compressible and arranged to be held elastically compressed by the pod door, itself held by the pod door locking means when the pod door is in the locked closed position.

In this description, the term "piece of equipment" designates any structure to which it is desired selectively to couple a transport pod for transferring flat articles. By way of example, such a piece of equipment may be a mini-environment enclosure, itself provided with a robot for handling flat articles. It may be constituted by a transfer chamber known as a "load lock". However it may equally well be any other evacuated chamber.

The term "front" designates an orientation perpendicular to the travel axis through the article-passing opening or the inlet/outlet opening. Thus, the "front" orientation lies in a vertical plane with a FOUP type transport pod having an opening in a side wall, and lies in a horizontal plane with a SMIF type transport pod having a bottom opening.

Such a combination of means with compressed gaskets makes it possible to obtain satisfactory sealing of the transport pod to maintain an appropriate vacuum in the transport pod for a duration that can extend not only over a period of transport, but also over quite a long period of storage.

Preferably, the pusher means enable axial thrust of sufficient strength to be applied to the pod door to compress the pod door front sealing means to beyond the compression provided by the pod door locking means. Such a disposition is favorable for making locking and unlocking easier, and in particular for enabling locking and unlocking to be performed without the mechanical parts being subjected to friction that might produce polluting particles.

In practice, in order to achieve locking and unlocking without friction, the pusher means are preferably adapted:

during a step of locking the pod door, to apply said axial thrust of sufficient strength to the pod door, and then to actuate the pod door locking means to lock the pod door, and finally to release axial thrust; and during a step of unlocking the pod door, to apply said axial thrust of sufficient strength to the pod door, then to actuate the locking means to unlock the pod door, and finally to release said axial thrust.

The pod door and the interface door need to be driven by actuator means provided in the interface. For this purpose, it is possible, advantageously, to provide detachable coupling means fitted in the door of the pod and in the door of the interface, and controlled by the door actuator means to reversibly secure the pod door against the interface door. As a result, in the coupled state, the pod door moves as a unit with the interface door between the closed position and the open position.

Advantageously, advantage can be taken of the two doors being coupled together to facilitate sealing the interface door. For this purpose, provision can be made for:

the interface door front sealing means to be elastically compressible; and in the coupled state, the axial thrust of sufficient strength simultaneously to compress the interface door front sealing means.

The thrust means also act as retaining abutments for conserving the position of the interface door.

Advantage may also be taken of the two doors being coupled together to simplify the door actuator means: the two coupled-together doors can be moved by means acting solely on the interface door.

However it is also necessary for the actuator means to produce said axial thrust of sufficient strength to compress the front sealing means. In a first embodiment, the door actuator means comprise:

first actuator means for displacing the doors between the open and closed positions; and second actuator means, distinct from the first actuator means, for applying said axial thrust of sufficient strength.

The advantage is that the second actuator means, which provides the axial thrust of sufficient strength, can produce movement over a short stroke but with relatively high force, and above all with good balance so that the pod door is indeed on the axis of the opening it closes.

Alternatively, the same door actuator means may serve both to move the door between the open and the closed positions, and to apply said axial thrust of sufficient strength.

In an advantageous embodiment, the apparatus comprises:
retaining means adapted to secure the transport pod reversibly against the wall surrounding the article-passing opening; and
interface front sealing means for providing, between the transport pod and the wall surrounding the article-passing opening, sealing against the external atmosphere around the inlet/outlet opening and the article-passing opening, when the transport pod is secured against said wall.

The invention also provides means for further reducing the risk of polluting particles escaping into the atmosphere inside the transport pod and the equipment, and in particular for reducing the risk of particles escaping from the polluted outside zones of the pod and interface doors. To do this, in an advantageous embodiment, the apparatus of the invention further comprises connection pumping means adapted to pump out the peripheral volume of gas that is held captive in the inter-gasket zone between the pod door, the interface door, the pod door front sealing means, the interface door front sealing means, and the interface front sealing means, when the transport pod is secured against the front wall of the interface and the doors are in the closed position.

Under such circumstances, and preferably, in the coupled-together state, the external face of the pod door presses directly against the external face of the interface door, which it covers without clearance and without overhang.

According to the invention, polluting particles in the inside atmosphere may also come from friction that occurs on the door sealing means. The invention thus provides means for reducing any risk of friction. In particular, in an advantageous embodiment, the door actuator means move the doors along two part strokes, specifically an axial part stroke between the closed position and a position that is axially set back towards the inside of the interface, and a transverse part stroke between the axially setback position and a laterally retracted position that releases the passage for flat articles between the transport pod and the equipment. By means of the axial movement, the gaskets are compressed without transverse friction, thereby reducing as much as possible any production of polluting particles by friction.

In an advantageous application, the door actuator means are provided in an evacuated interface fitted to the inlet of a piece of equipment, such as a transfer chamber or a process chamber or indeed an evacuated chamber. A robot for handling flat articles is provided in the transport pod, or in the interface, or preferably in the equipment. Such an interface thus replaces the load locks which, in the prior art, need to be fitted with an interface and with pumping means in order to operate alternatively at atmospheric pressure and at low pressure.

Under certain circumstances, it can happen that the pod door is poorly repositioned. The pod door can then come directly into contact with the pod, and the friction created in this way is a major source of particles. In the worst of cases, the pod door can even jam. Misalignment of the pod door can also lead to misalignment of the pod door locking means relative to the alignment of the detachable coupling means, thereby preventing the pod door from being locked or unlocked. Finally, if the pod door and the interface door are not parallel, then the sealing means (gaskets) can be subjected to twisting, causing them to roll in their grooves. This leads to particles being created and to the gaskets wearing quickly and significantly.

In a particular embodiment of the invention, centering means are also provided in the interface door and/or in the pod door to guide the pod door towards the interface door and to hold them when the two doors are coupled together.

Preferably, at least one centering means is provided in the interface door comprising a peg with a spherical head and a spring housed in the housing of the guide-forming interface door, and at least one centering means in the pod door comprising a housing adapted to receive the corresponding centering means of the interface door.

Also preferably, each of the centering means provided in the interface door comprises a peg with a spherical head and a spring housed in the housing in the interface door provided for this purpose. The centering means of the interface door are preferably situated close to the detachable coupling means and on the outside. This disposition ensures that the doors are kept parallel better.

The centering means provided in the pod door preferably have two housings corresponding to the centering means of the interface door. These housings are adapted to receive the pegs of the centering means of the pod door. They are preferably conically-shaped, making it possible to receive and lock the head of the interface door peg.

BRIEF DESCRIPTION OF THE DRAWING

Other objects, characteristics, and advantages of the present invention appear from the following description of particular embodiments, given with reference to the accompanying figures, in which.

DETAILED DESCRIPTION

Figure 1:
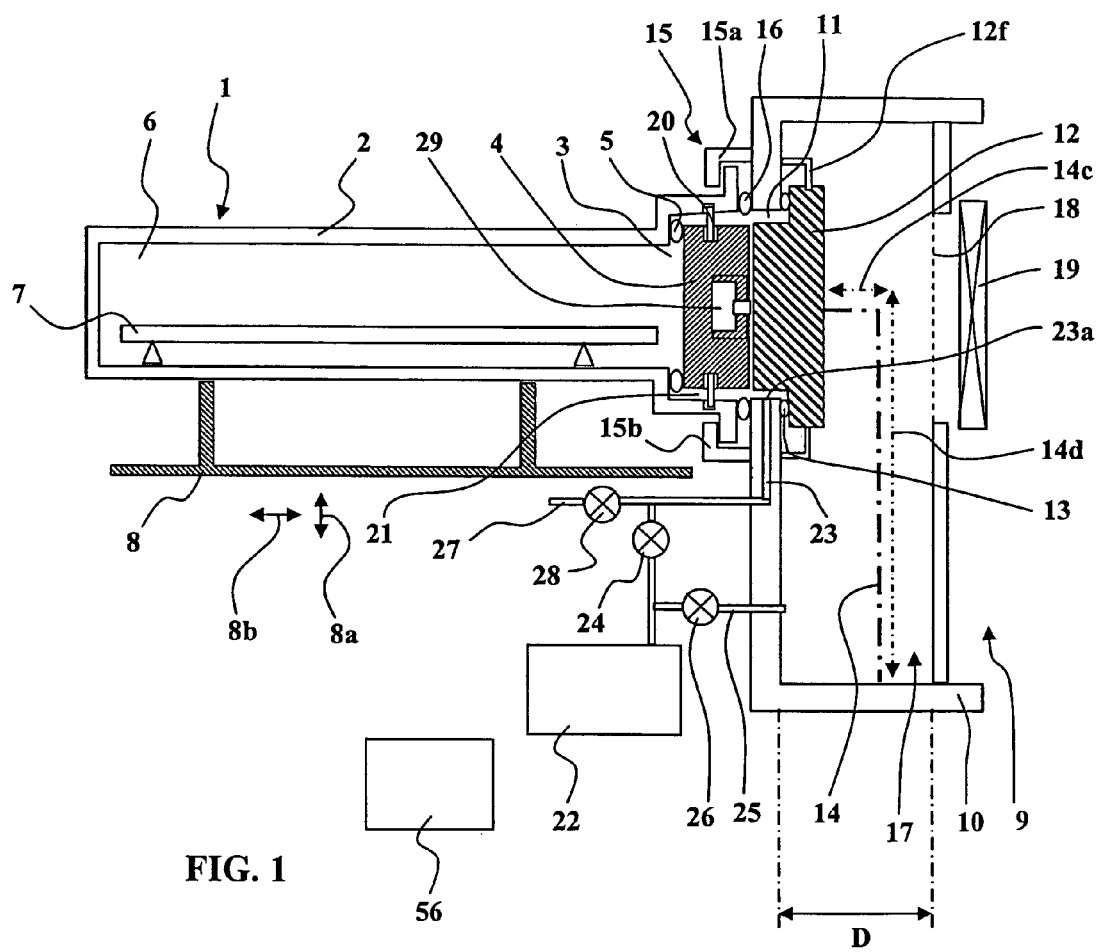
FIG. 1 is a diagrammatic side view in longitudinal section of a transport pod coupled to a piece of equipment in an embodiment of the present invention, the pod and interface doors being in the closed position.

Reference is made initially to FIG. 1 which is a diagrammatic side view in longitudinal section of transport apparatus in an embodiment of the present invention.

There can be seen a transport pod 1 with an opening in a side wall, having a leakproof peripheral wall 2 and an inlet/outlet opening 3 that is closable by a pod door 4 associated with front sealing means 5 for the pod door.

The structure of the transport pod 1 must be mechanically strong in order to be capable of withstanding external atmospheric pressure in the presence of a vacuum in its internal cavity 6.

Inside the internal cavity 6, there is shown a flat article 7 such as a semiconductor wafer or a mask, placed in the transport pod 1 in order to be moved between two successive sites.

The transport pod 1 rests on a pod support 8 that is vertically and horizontally movable, as represented by arrows 8a and 8b.

Figure 2:
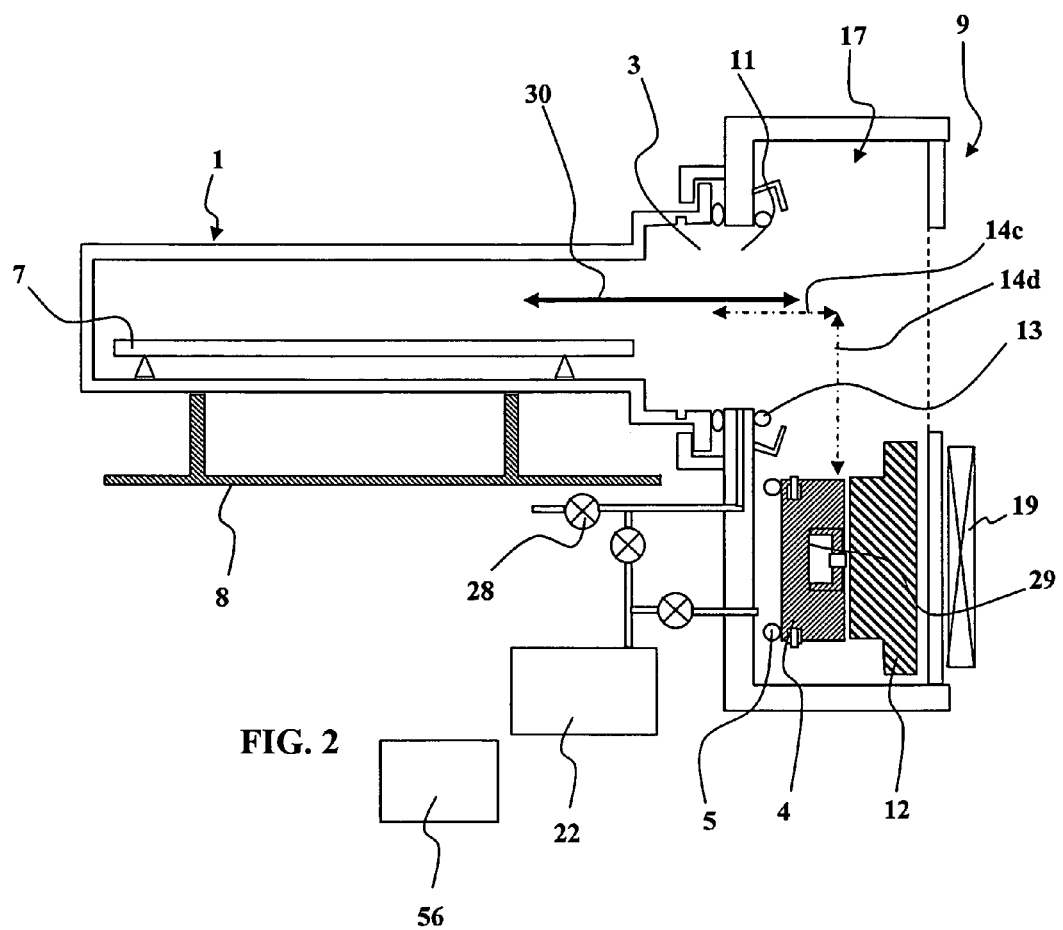
FIG. 2 is a view similar to FIG. 1 with the pod and interface doors being in the retracted position.

There can also be seen a piece of equipment 9 having a leakproof peripheral wall 10 with an outlet orifice 18 that is closed by an equipment door 19. The equipment is associated with a leakproof interface 17 having an article-passing opening 11 closed by an interface door 12 associated with front sealing means 13 for the interface door. Door actuator means 14 represented diagrammatically by chain-dotted lines are provided in the interface 17 to move the pod door 4 and the interface door 12 between a closed position as shown in FIG. 1 and an open position where they are offset into the interface 17 as shown in FIG. 2. Interface door locking means 12f enable the interface door 12 to be locked selectively in its closed position.

In FIG. 1, the transport pod 1 is shown in its coupling position on the interface 17, the pod door 4 being in register with the interface door 12. In this position, retaining means 15 comprising a top jaw 15a and a bottom jaw 15b hold the transport pod 1 reversibly against the wall surrounding the article-passing opening 11. Front sealing means 16 for the interface are interposed between the transport pod 1 and the interface 17 so as to provide sealing between the transport pod 1 and the wall surrounding the article-passing opening 11 to provide sealing against the outside atmosphere around the inlet/outlet opening 3 and the article-passing opening 11.

It will be understood that the retaining means 15 urge the transport pod 1 towards the interface 17, compressing the front sealing means 16 of the interface, which sealing means may possibly be deformed, as shown.

In the embodiment shown in FIG. 1, the door actuator means 14 are located inside the interface 17 which is itself fitted and secured to the inlet of the equipment 19. Opposite from the article-passing opening 11, the interface 17 has an outlet orifice 18 putting the interface 17 into communication with the inside of the equipment 9, which equipment 9 is provided with an equipment door 19 for selectively closing the outlet orifice 18.

Alternatively, the door actuator means 14 could be designed to be moved sideways towards the outside, and/or the interface 17 could be directly integrated in the equipment 9, without there being an equipment door 19.

The pod door 4 is associated with pod door locking means 20 suitable for being actuated by actuator means mounted in the interface 17 so as to lock and unlock the pod door 4 in the closed position in which it is closing the inlet/outlet opening 3. The pod door locking means 20 comprise, for example, latches carried by the pod door 4, actuated to slide radially by coupling means 29, themselves actuated from the interface 17, and engaging in housings provided in the leakproof peripheral wall 2 of the transport pod 1.

Figure 3:
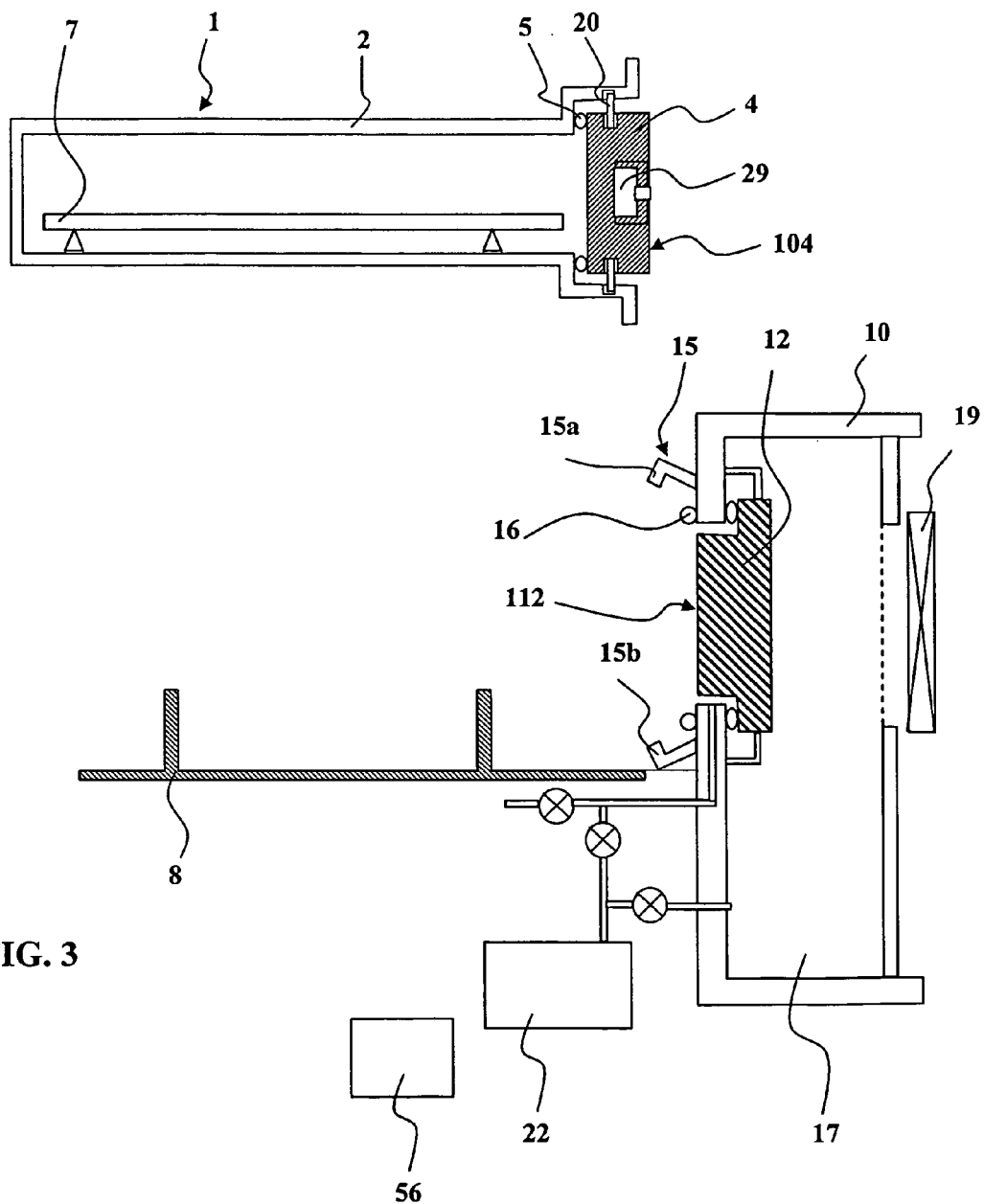
FIG. 3 is a view similar to FIG. 1 in which the transport pod is closed by its pod door, the interface is closed by its interface door, and the transport pod is spaced apart from the interface.

In the closed position shown in FIGS. 1 and 3, for example, the pod door 4 is retained by the pod door locking means 20, and it keeps the front sealing means 5 of the pod door elastically compressed. In these figures, the front sealing means 5 of the pod door are shown as being deformed in compression, with their axial thickness (horizontal in the figures) being reduced.

Thus, the front sealing means 5 of the pod door are elastically compressible both to ensure good sealing, and to make the door easier to lock and unlock.

The front sealing means 16 of the interface constitute peripheral sealing means for isolating from the atmosphere a coupling zone between the respective front faces of the transport pod 1 and the interface 17 around the article-passing opening 11 and the inlet/outlet opening 3. In FIG. 1, this coupling zone is shown containing the pod door 4 and the interface door 12 together with a peripheral volume 21. The peripheral volume 21 is a volume of gas held captive in the inter-gasket zone between the pod door 4, the interface door 12, the front sealing means 5 of the pod door, the front sealing means 13 of the interface door, and the front sealing means 16 of the interface. When the pod door 4 and the interface door 12 are opened, this volume 21 is in direct communication with the inside cavity 6 of the transport pod 1 and with the inside of the interface 17. Initially, this peripheral volume 21 is at atmospheric pressure, and it can be seen that it is necessary to provide pumping means to evacuate the peripheral volume 21 before opening the doors.

To do this, connection pumping means are provided.

The connection pumping means comprise a connection pumping duct 23 having an inlet orifice 23a communicating with the peripheral volume 21 between the front sealing means 16 of the interface and the front sealing mans 13 of the interface door, and having its outlet connected to a vacuum pump device such as a pump 22, with a connection pumping control valve 24 being interposed thereon.

The vacuum pumping device is also connected via an interface pumping duct 25 to the inside space of the interface 17, with an interface pumping control valve 26 being interposed thereon.

The connection pumping means are also adapted to establish selectively in the peripheral volume 21 a pressure level that is substantially equal to the surrounding pressure outside the apparatus. For this purpose, a balancing duct 27 provided with a balancing valve connects the connection pumping duct 23 and/or the peripheral volume 31 to the outside of the apparatus.

The connection pumping means further comprise control means such as a microprocessor or microcontroller 56 suitable for controlling the gas pressures that exist within the interface 17 and the peripheral volume 21. For this purpose, the microprocessor or microcontroller 56 controls the pump 22 and the valves 24, 26, and 28 as a function of signals it receives from various sensors (not shown in the figures) and as a function of a stored program.

As a result, the connection pumping means, constituted by all of the pumping means 22 to 28 and by the control means 56 are adapted to balance pressures during the various operating steps.

For example, during the step of docking a transport pod 1 against the interface 17, the peripheral volume 21 is initially at atmospheric pressure, while the atmosphere inside the transport pod 1 may be at a first low pressure, and the interface 17 may be at a second low pressure that might be different from the pressure inside the transport pod 1. Before opening the pod and interface doors 4 and 12, the connection pumping means 22-28, 56 can be used to establish a gas pressure inside the peripheral volume 21 that is substantially equal to the pressure inside the transport pod 1.

If necessary, the connection pumping means 22-28, 56 establish a gas pressure in the interface 17 that is substantially equal to the pressure inside the transport pod 1, while the equipment door 19 is closed. It is then possible to open the pod and interface doors 4 and 12. Thereafter, the connection pumping means establish selectively, in the interface 17 and in the transport pod 1, once the pod and interface doors 4 and 12 are opened but while the equipment door 19 is still closed, a gas pressure that is substantially equal to the pressure inside the equipment 9. It is then possible to open the equipment door 19 for the purpose of transferring flat articles between the transport pod 1 and the equipment 9.

During a later step, e.g. after the flat articles have been transferred into the transport pod 1, the equipment door 19 is closed. The connection pumping means 22-28, 56 can then be adapted to establish selectively, in the interface 17 and in the transport pod 1, and while the pod and interface doors 4 and 12 are still open, a gas pressure that is substantially equal to the pressure that is desired within the transport pod 1. Thereafter the pod and interface doors 4 and 12 are closed, and then the connection pumping means return the peripheral volume 21 to atmospheric pressure so as to allow the transport pod 1 to be decoupled and moved apart from the interface 17.

In FIG. 1, there can also be seen detachable coupling means 29 provided in the pod door 4 and in the interface door 12, these means being controlled by the door actuator means 14 so as to secure the pod door 4 reversibly against the interface door 12. In the coupled state, as shown in FIG. 1, the pod door 4 moves as a unit with the interface door 12 between the closed position and the open position.

The detachable coupling means 29 may be constituted in conventional manner as in the present interfaces for coupling a FOUP type transport pod with a key provided on the interface door 12 that penetrates into a suitable housing in the pod door 4. In practice, a plurality of bolts can be provided, which are distributed over the surfaces of the doors.

FIGS. 1 to 3 are considered below in succession showing the state of the apparatus during different steps in operation. In FIG. 1, the transport pod 1 is coupled to the interface 17, the doors 4 and 12 being closed and locked. The detachable coupling means 29 secure the pod door 4 to the interface door 12. A vacuum is initially established in the peripheral volume 21 by the pump 22, the connection pumping control valve 24, and the connection pumping duct 23.

From this condition, in order to open the transport pod 1 and put it into communication with the equipment 9, the locking means 20 and 12f are actuated to unlock the doors 4 and 12, and the door actuator means 14 move both doors 4 and 12 as a unit along two part strokes, firstly along an axial part stroke 14c between the closed position and a position that is axially set back towards the inside of the interface 17, and then sideways away from the article-passing opening 11 by a transverse part stroke 14d between the axially setback position and a laterally retracted position which releases the passage for flat articles 7 between the transport pod 1 and the equipment 9, the apparatus then being in the state shown in FIG. 2. Simultaneously, or subsequently, the door 19 of the equipment 9 is opened. Under these conditions, the passage is fully released for moving the flat articles 7, as represented by double-headed arrow 30.

Thereafter, in order to reclose the transport pod 1, the door actuator means 14 move the doors 4 and 12 along the same strokes in reverse in order to return to the position shown in FIG. 1. The pod door locking means 20 and the interface door locking means 12f are then actuated.

By using the balancing valve 28, atmospheric pressure is reestablished in the peripheral volume 21. The detachable coupling means 29 are then actuated to unlock the pod door form the interface door 12, and finally the retaining means 15 are operated to release the transport pod 1, which can then be moved apart from the interface 17, as shown in FIG. 3. In this state, the transport pod 1 is closed in leaktight manner by the pod door 4 which is held securely by the pod door locking means 20.

In the invention, while closing the transport pod 1, pusher means are provided for applying axial thrust on the pod door 4 directed towards the inside of the transport pod 1, thereby compressing the front sealing means 5 of the pod door. By way of example, the pusher means can be constituted by the door actuator means 14, structured so as to produce such axial thrust, and associated with the interface door locking means 12 and the retaining means 15. Alternatively, specific pusher means can be provided, as described below.

Figure 4:
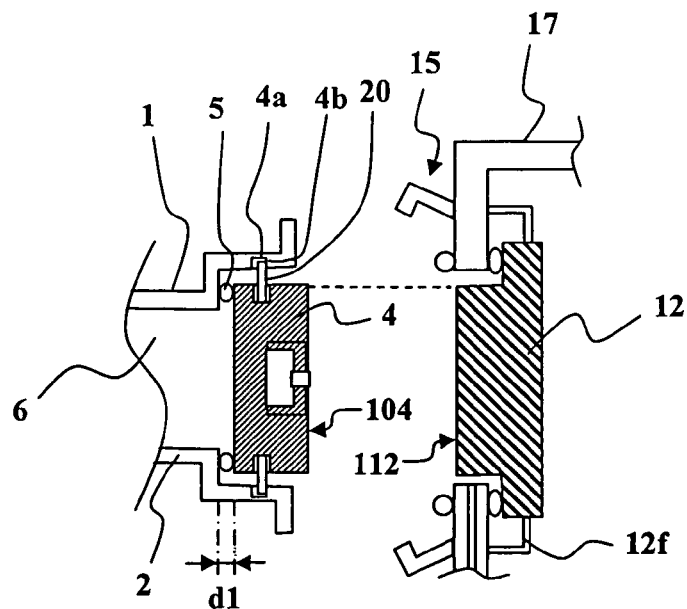
FIG. 4 is a view on a larger scale showing the detail of the doors and the sealing means when the transport pod is apart from the interface.
Figure 5:
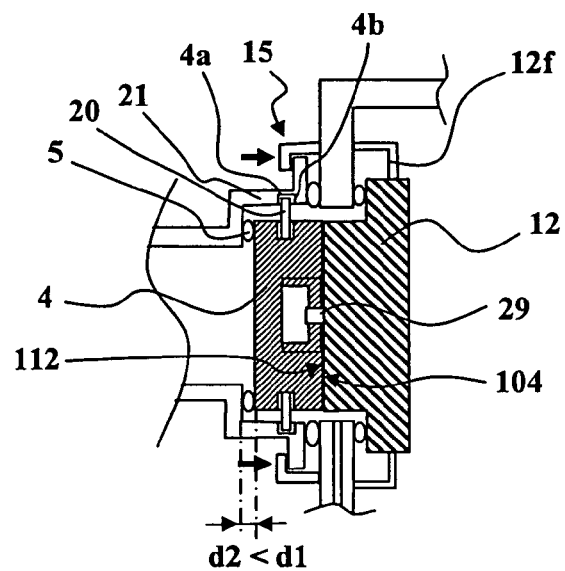
FIG. 5 is a view similar to FIG. 4 during a coupling step in which both doors are still locked, the transport pod being secured to the interface.
Figure 6:
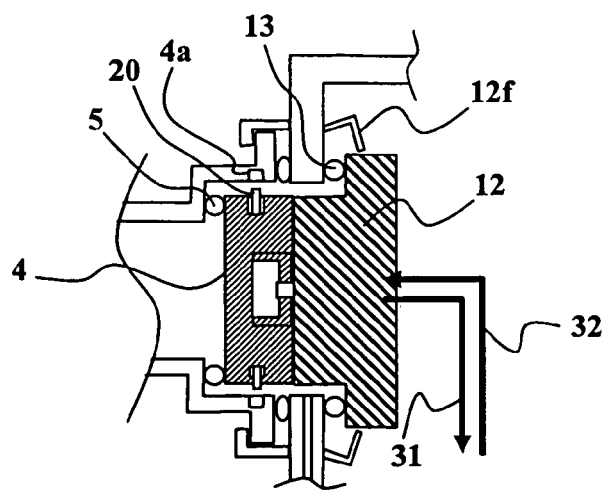
FIG. 6 is another view similar to FIG. 4, with the two doors coupled to each other and unlocked, this figure showing the movements of the doors.

Reference is now made to FIGS. 4 to 6 while explaining an additional function that can be associated with the pusher means in a particular embodiment of the invention.

FIG. 4 is a fragmentary view of the opening zones of the transport pod 1 and of the interface 17, and it shows the same elements as in FIGS. 1 to 3, these elements being identified by the same numerical references.

The pod door locking means 20 are represented diagrammatically in the form of bolts that move sideways, which bolts are provided in the pod door 4 and can engage in housings 4a in the leakproof peripheral wall 2 of the transport pod 1. In the locked state, shown in FIG. 4, the pod door 4 is held by the locking means 20, with the bolts pressing in their housings 4a against the distal faces 4b thereof, leaving clearance towards the inside. The pod door sealing means 5 is in the relatively compressed state, thereby providing good sealing protecting the inside cavity 6 against the external atmosphere. The state of axial compression of the front sealing means 5 of the pod door is represented by the distance d1.

Simultaneously, the interface door 12 is locked to the interface wall 17 by the interface door locking means 12f.

The surrounding atmospheric pressure contributes to retaining the pod door 4 against the leakproof peripheral wall 2, so as to hold the pod door 4 closed. However the pod door locking means 20 provide greater security in closure, since their action does not depend on the pressure that exists in the inside cavity 6 of the transport pod 1.

In FIG. 5, the transport pod 1 has been brought to press against the front face of the interface 17. The outside face 104 of the pod door 4 then comes to bear directly against the outside face 112 of the interface door 12, which itself forms an axial abutment, and which it preferably covers without clearance and without overhang.

The retaining means 15 force the transport pod 1 against the interface 17 so that the abutment constituted by the interface door 12 pushes the pod door 4 towards the inside of the transport pod 1 over a short stroke that further comprises the front sealing means 5 of the pod door: the distance d2 is shorter than the distance d1. The pod door locking means 20 is thus offset in the housing 4a away from the distal face 4b of the housing. It is then easy to operate the locking means 20 without friction so as to move out of the housings 4*a*. Simultaneously, a vacuum is established in the peripheral volume 21, and the two doors 4 and 12 are locked to each other by actuating the detachable coupling means 29.

The door actuator means 14 can then take both doors 4 and 12 along the opening stroke represented by arrow 31 in FIG. 6.

Thereafter, for closure purposes, the door actuator means 14 moves the doors 4 and 12 in the closure direction represented by arrow 32 in FIG. 6, bringing the doors 4 and 12 back into the closed position bearing frontally respectively in the inlet/outlet opening 3 and in the article-passing opening 11. Axial thrust is applied on the doors 4 and 12 towards the transport pod 1 so as to compresses the front sealing means 5 of the pod door and the front sealing means 13 of the interface, with this being done by the pusher means, and the doors are locked respectively by the pod door locking means 20 and the interface door locking means 12*f*. Air can then be introduced into the peripheral volume 21, reestablishing atmospheric pressure, and the detachable coupling means 29 can be unlocked, after which the transport pod 1 can be released by opening the retaining means 15 so as to return to the state shown in FIG. 4.

Reference is now made to FIGS. 7*a* to 7*d* which show one possible structure for the door actuator means. These figures show the door actuator means in side view. The interface door 12 is secured to two transverse pins 12*b* and 12*c* having respective ball bearings 12*d* and 12*e* mounted at their free ends. The same structure is provided on both sides of the interface door 12.

The ball bearings 12*d* and 12*e* move along an F-shaped guide path 33 (the F-shape is back to front in the figure) having a transverse limb 33*a* (vertical limb) and two axial limbs 33*b* and 33*c* (horizontal limbs) at different transverse positions relative to each other, the first axial limb 33*b* being connected to the top end of the guide path 33 while the lower limb 33*c* is connected close to the middle portion of the transverse limb 33*a*.

A fork 34 is mounted to turn about a horizontal fork axis 35 and engage on the ball bearing 12*e*. The fork 34 can thus pivot about the fork axis 35 under drive from a link 36, itself actuated by an actuator 37 and coupled via a link pin 36*a*.

Figure 7:
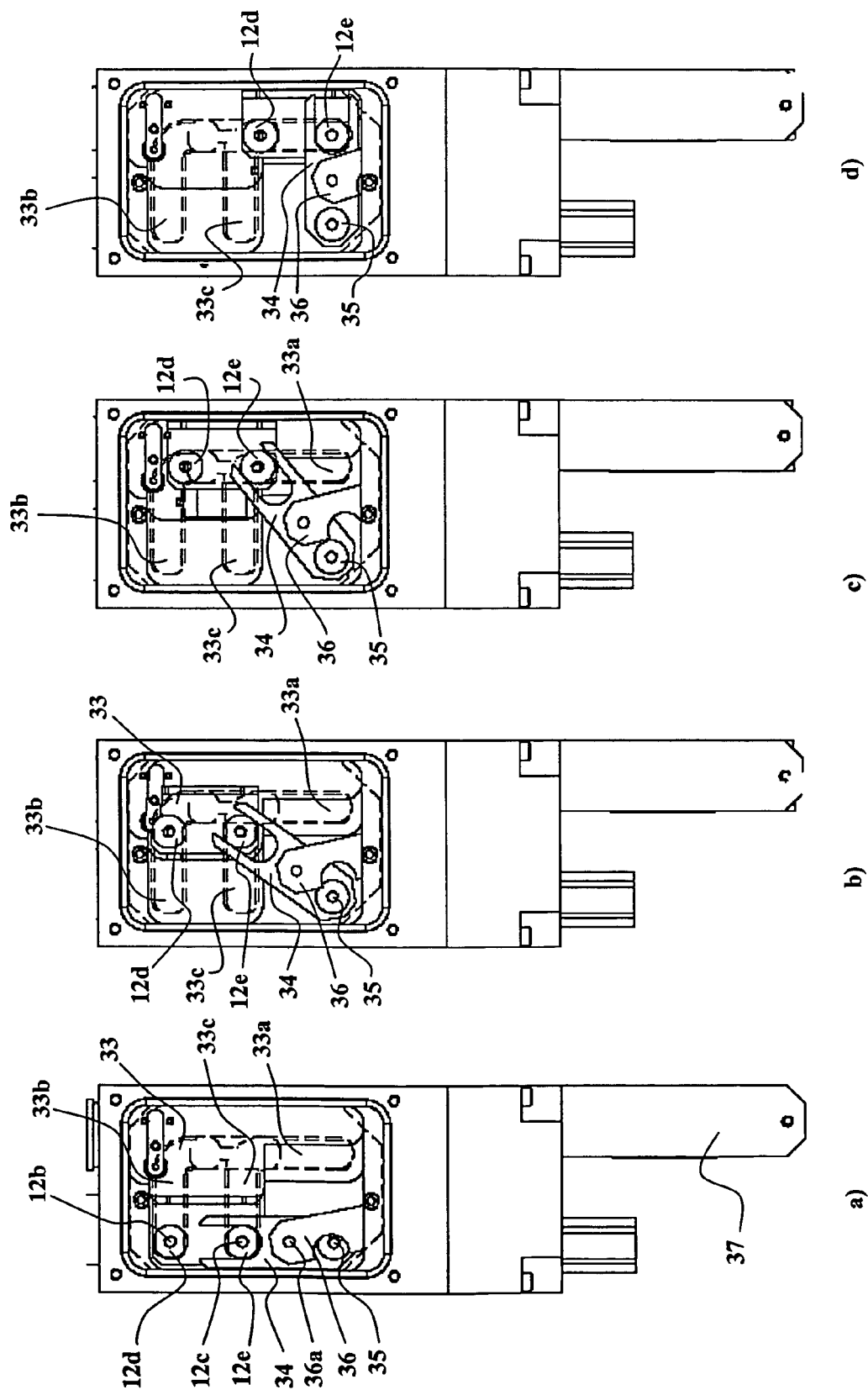
FIGS. 7a, 7b, 7c, and 7d show four successive steps in the operation of door actuator means in an embodiment of the present invention.
Figure 8:
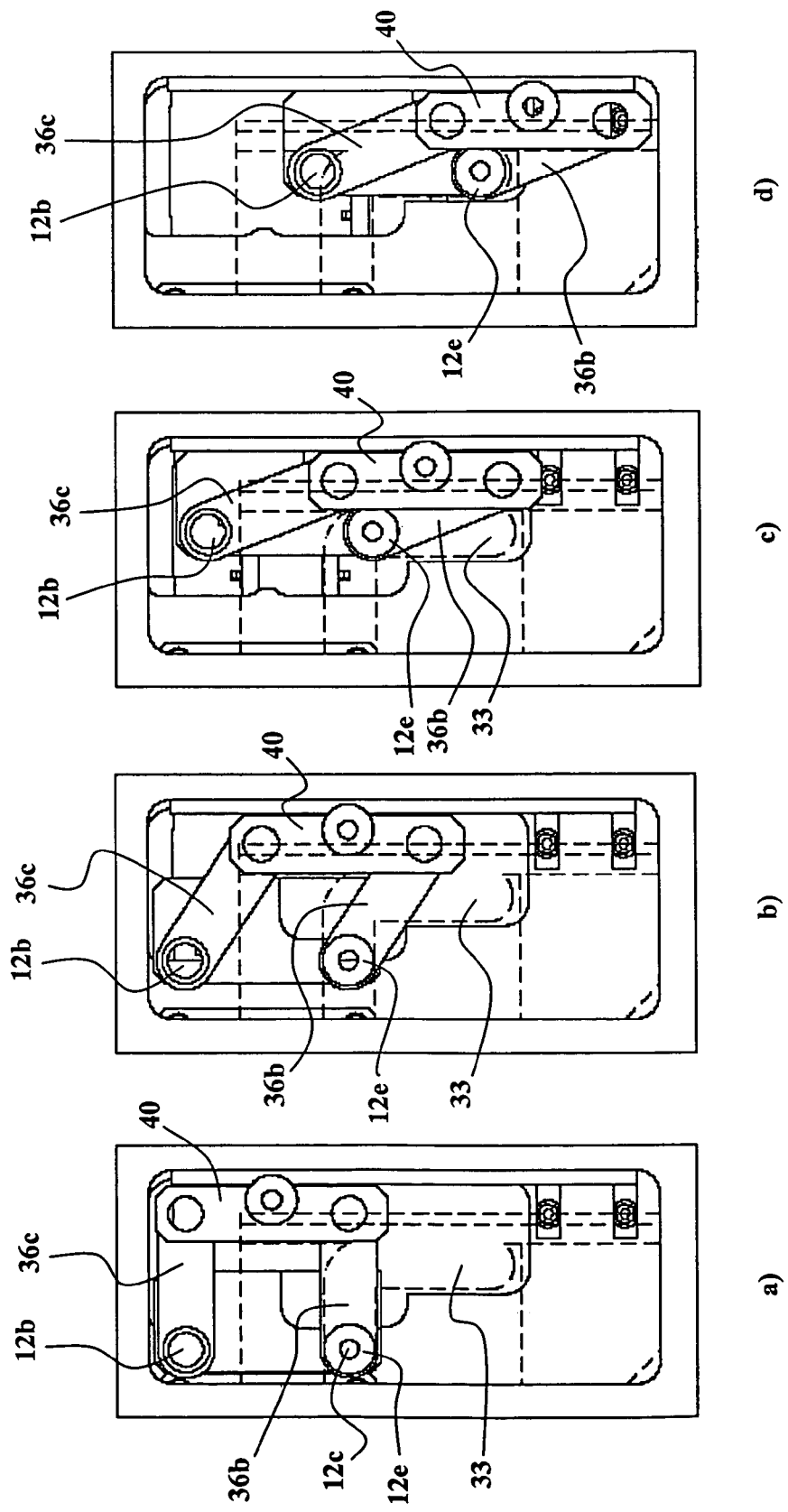
FIGS. 8a, 8b, 8c, and 8d show four successive steps in the operation of a door actuator mechanism in an other embodiment of the invention.

When the fork 34 is vertical, as shown in FIG. 7*a*, the ball bearings 12*d* and 12*e* are at the left-hand end of the guide path 33, i.e. towards the transport pod 1, the interface door 12 then being closed. By turning the fork 34 to the right, as shown in FIG. 7*b*, the interface door 12 is moved axially in the opening direction, with the ball bearings 12*d* and 12*e* moving along the axial limbs 33*b* and 33*c* of the guide path 33. Thereafter; by additional pivoting of the fork 34, as shown in FIGS. 7*c* and 7*d*, the interface door is moved transversely with the ball bearings 12*d* and 12*e* moving along the transverse limb 33*a* of the guide path 33. In FIG. 7*d*, the interface door 12 is in the retracted position as shown in FIG. 2.

The door actuator means as described above serve to move the doors 4 and 12 along two part strokes, i.e. an axial part stroke between the closed position (FIG. 7*a*) and a position in which they are axially offset towards the inside of the process equipment 9 (FIG. 7*b*), and a transverse part stroke between the axially setback position (FIG. 7*b*) and a laterally retracted position (FIG. 7*d*), thereby releasing the passage for flat articles between the transport pod 1 and the process equipment 9.

FIGS. 8*a* to 8*d* show another embodiment of the means for actuating the interface door, based on a parallelogram linkage. This embodiment has the same transverse pins 12*b* and 12*c* secured to the interface door, and there is a guide path 33 along which there runs a single ball bearing 12*e* on the transverse pin 12*c*. A carriage 40 slides vertically under drive from an actuator (not shown) and is hinged by two links 36*b* and 36*c* to the two transverse pins 12*b* and 12*c*, respectively. Vertical movement of the carriage 40 produces two strokes, firstly an axial stroke and then a transverse stroke for the interface door, as shown in the figures. Simultaneously, these door actuator means serve to apply said axial thrust of sufficient strength.

Figure 9:
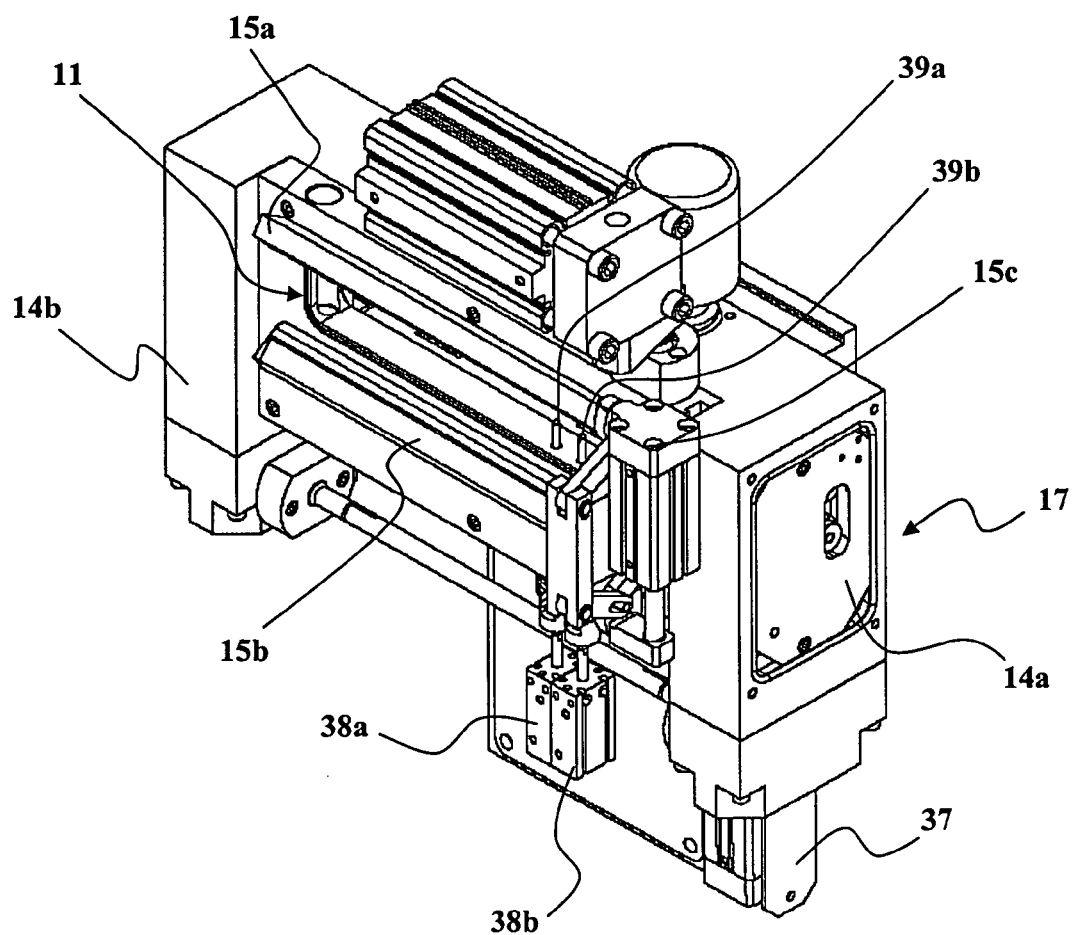
FIG. 9 is a perspective view showing an interface of an embodiment of the present invention.
Figure 10:
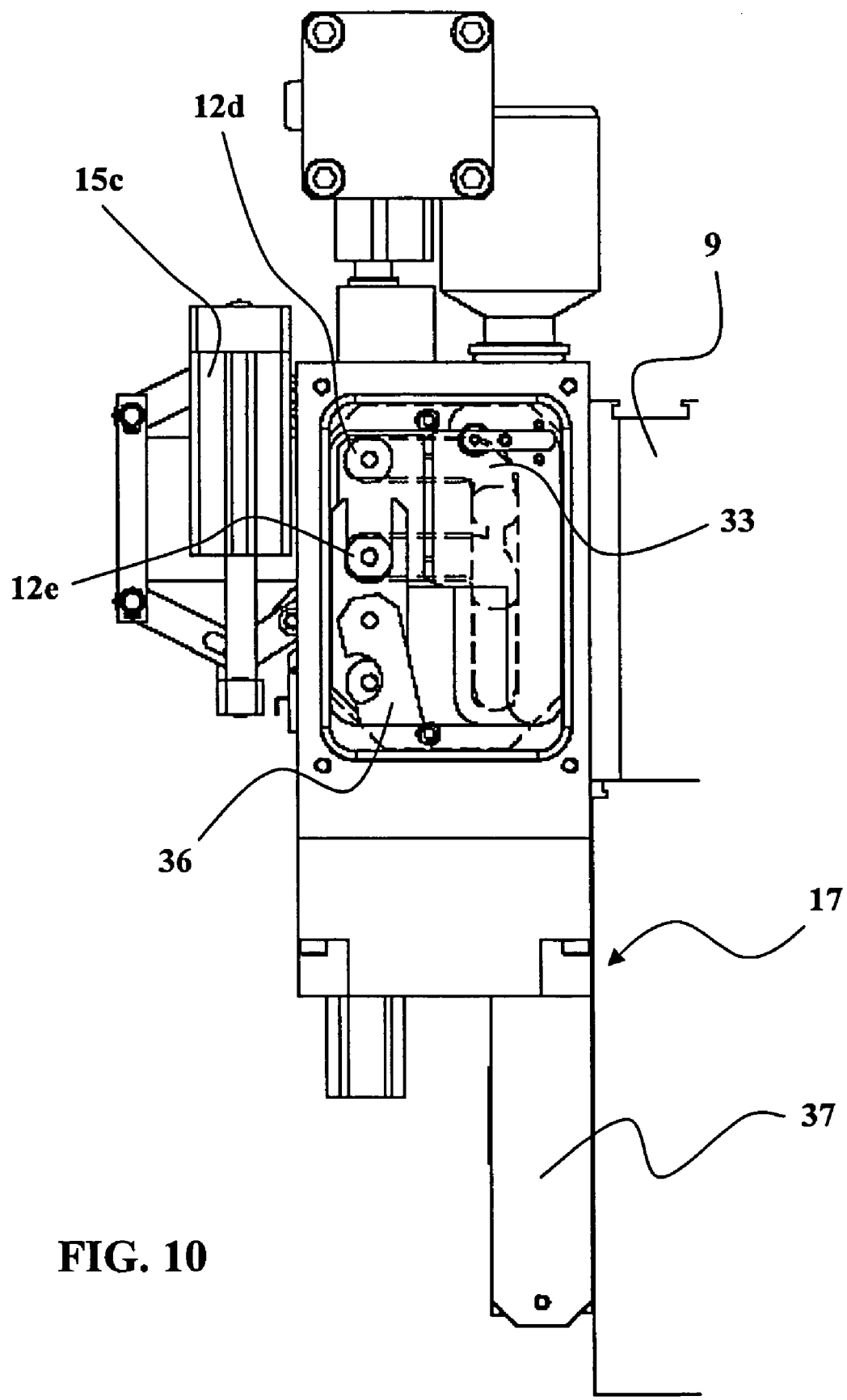
FIG. 10 is a side view of the FIG. 9 interface, showing the door actuator mechanism.
Figure 11:
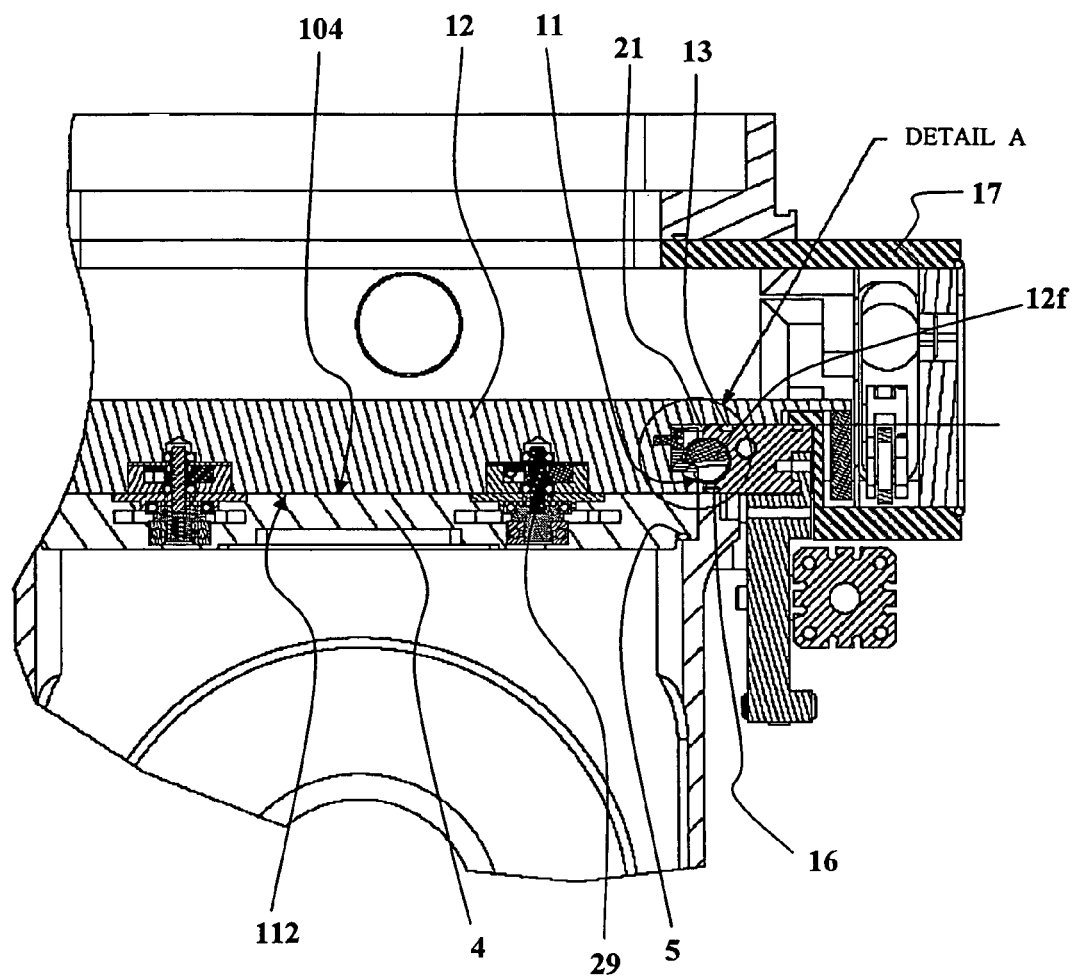
FIG. 11 is a plan view in section of the FIG. 9 interface, associated with a transport pod, the doors being closed and locked.

Reference is now made to FIGS. 9 to 11 which show one possible embodiment of the means shown diagrammatically in the preceding figures.

In this embodiment, the invention is implemented in the form of an interface 17 for securing to the inlet of a piece of equipment that is not shown. There can be seen the article-passing opening 11 and the pod retaining means constituted by top and bottom jaws 15*a* and 15*b* actuated by a pod-holding jaw actuator 15*c*. The door actuator means are contained in two side units 14*a* and 14*b* driven by an actuator 37. Two locking actuators 38*a* and 38*b* drive two respective locking pegs 39*a* and 39*b* vertically, which pegs project into the article-passing opening 11 so as to actuate the detachable coupling means provided between the pod door 4 and the interface door 12, and so as to actuate the pod door locking means 20.

Figure 12:
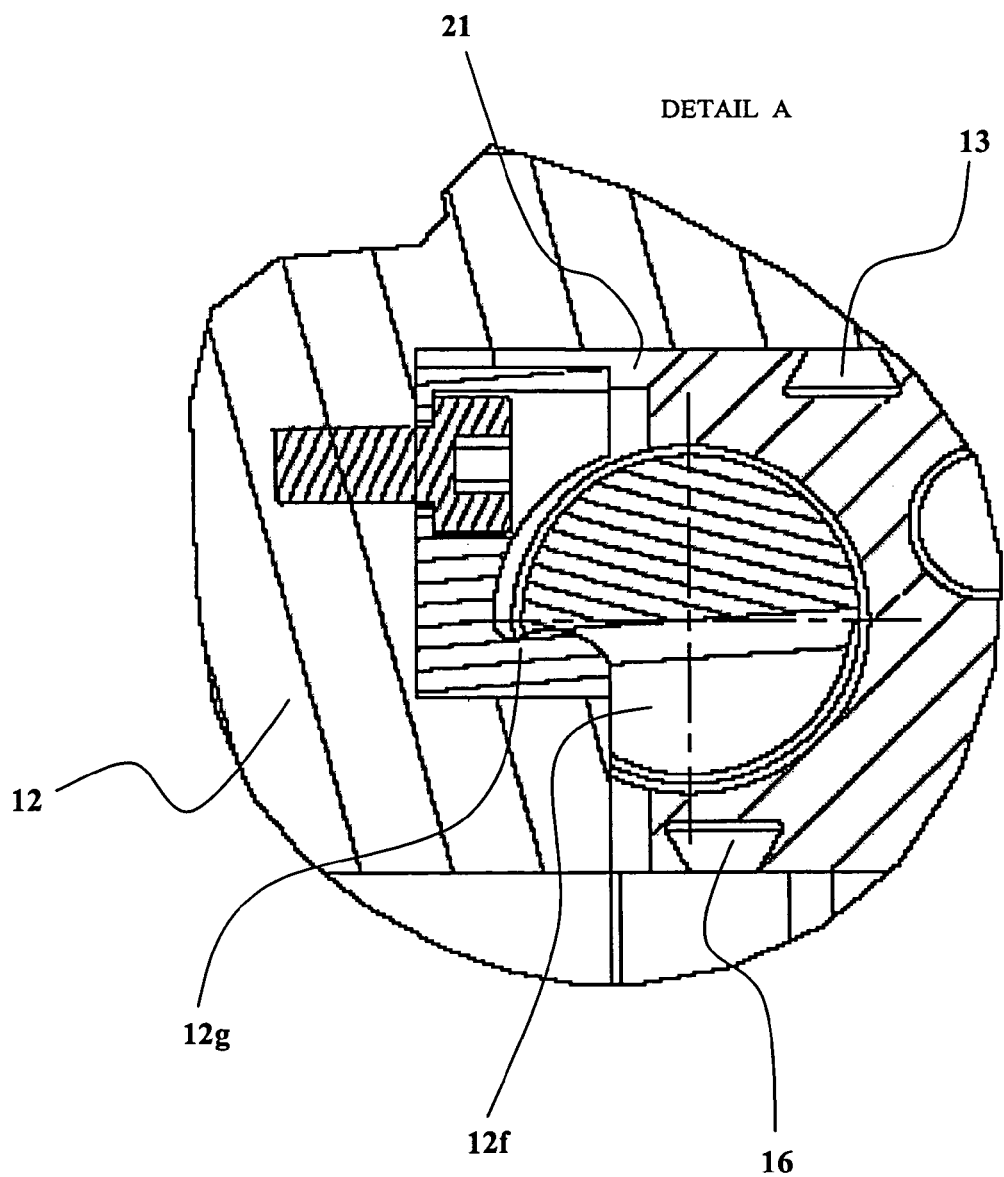
FIG. 12 is a view of detail A in FIG. 11, showing diagrammatically the structure of the thrust and locking means of the interface door.

In the embodiment shown in FIGS. 11 and 12, the interface door locking means 12*f* are implemented in the form of a semicylindrical vertical shaft mounted laterally in the interface wall 17, and having a corner that can be brought to press against an involute-shaped cam 12*g* provided in the side edge of the interface door 12 when the shaft 12*f* turns counterclockwise in the figures. Locking and unlocking is thus achieved by axial thrust without friction.

The shafts 12*f* simultaneously constitute second actuator means, distinct from the first actuator means 14 and serving to provide said axial thrust of sufficient strength.

Two shafts 12*f* are disposed on either side of the interface wall 12 so as to balance the thrust applied in the axial direction.

FIGS. 11 and 12 show the front sealing means 16 of the interface, the front sealing means 5 of the pod door, and the front sealing means 13 of the interface door. It can be seen that in the embodiment shown, the peripheral volume 21 is kept down to a minimum by the fact that the outer face 112 of the interface door 12 presses directly against the outer face 104 of the pod door 4 which it covers without clearance, and substantially without overhang. The periphery of the pod door 4 substantially matches the periphery of the interface door 12 and of the article-passing opening 11.

Figure 13:
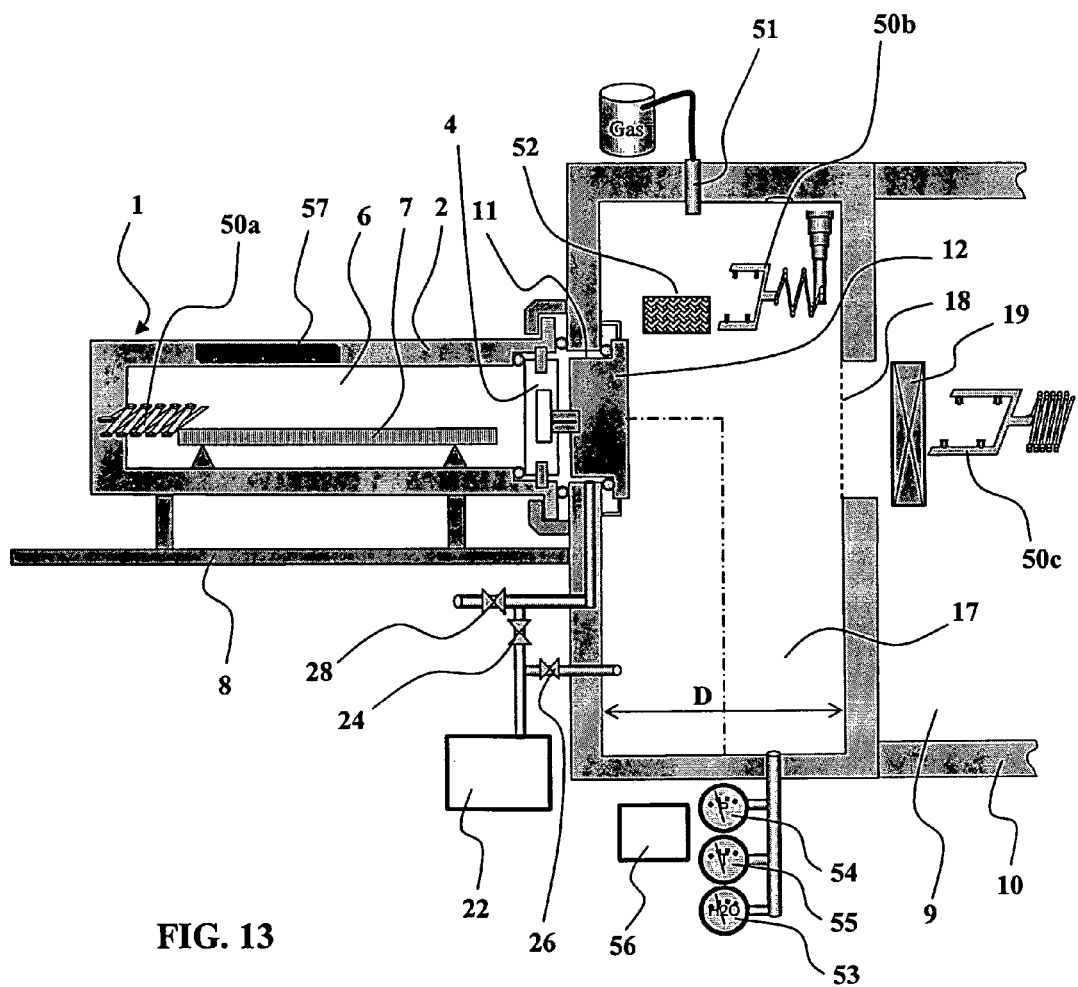
FIG. 13 is a side view of apparatus in another embodiment of the invention.

FIG. 13 shows other embodiments of the apparatus of the invention. In this figure, there can be seen the same essential elements as described above with reference to FIG. 1, and these essential elements are identified by the same numerical references.

In order to handle the flat articles 7, the flat article manipulator may be placed inside the transport door 1 as identified by numerical reference 50*a*, or it may be placed in the interface 17 as identified by numerical reference 50*b*, or it may be placed in the equipment 9 as illustrated by numerical reference 50*c*, with this being the preferred location.

The pod support device 8 may advantageously be movable relative to the interface 17, both vertically and horizontally in order to carry one or more transport pods 1 and to move them so as to bring them into register with the article-passing opening 11. The user can thus place a plurality of transport pods 1 on a single support device 8, and the device can then take a plurality of flat articles in succession for processing in the equipment 9.

The invention also provides for effectively conditioning the transport pod 1 and the interface 17 to further reduce any risk of polluting the flat articles 7.

For this purpose, provision may advantageously be made for the interface 17 to constitute the device that serves to lower the pressure of the atmosphere inside the transport pod 1 down to a pressure that is low enough for reducing the number of particles floating in the atmosphere inside the transport pod 1. However, during pumping to establishes a vacuum in the transport pod 1, there exists a certain risk of contamination, for example a risk of moisture being deposited on the flat article 7, with the moisture coming from the vapor contained in the atmosphere. For this purpose, a purge device 52 may advantageously be provided for purging with dry air, or with some other gas such as nitrogen.

Particulate contamination generated externally or internally by mechanical parts rubbing against one another can also degrade the flat article 7. The risk of such degradation can be avoided by using a thermophoresis plate 52 placed inside the interface 17. The thermophoresis plate 52 is a plate that is cooled, e.g. by a Peltier effect element, thereby creating a temperature gradient that attracts particles. The thermophoresis plate 52 is placed facing the active face of the flat article 7. The presence of such a thermophoresis plate 52 is particularly advantageous since particulate contamination, if any, is generated in principle by friction between mechanical parts during opening and closing of the doors.

The purge device 51 can reduce contamination in several ways. Purging prevents the condensation that results from the gas expanding during pumping, purging with an inert gas can reduce the expansion ratio of the gas and can reduce the partial pressure of the water vapor initially contained in the transport pod 1 and the interface 17, the particles suspended in the inside atmosphere can be swept away by purging, and the molecular contamination that results from degassing can be avoided by injecting an inert gas.

During pumping to evacuate the transport pod 1, rapid pumping can lead to gas expanding rapidly, which expansion results in a rapid drop in the temperature of the gas and can lead to it becoming saturated in water vapor. This can be avoided by combining purging with gas and pumping at an appropriate speed. Optimizing pumping speed and the quantity of purge gas can be controlled by installing a humidity sensor 53, a pressure sensor 54, and possibly also a temperature sensor 55 for monitoring the state of the atmosphere inside the interface 17. A controller 56 can automatically adjust pumping speed as a function of signals received from the sensors 53-55 so as to optimize the lowering of pressure. The controller 56 may be based on a microcontroller or a microprocessor, depending on requirements.

The vacuum pump 22 may be driven by a variable speed motor suitable for controlling pumping speed. By starting pumping at a relatively low speed during a preliminary step, pumping is performed gently so as to avoid water condensing. A variable speed pump is advantageous against particulate contamination since it does not require any valve for controlling pressure by moving the valve. It is known that pressure control valves are a major source of particulate contamination.

The controller 56 is coupled to various sensors installed in the interface 17 for controlling the quantity of gas that is injected, the pumping speed, and the force of the thermophoresis plate. This makes it possible to avoid water condensing by adjusting pumping speed. Before opening the interface, the pressures in the interface and around the flat article 7 must be equal. The controller 56 can establish this balance by adjusting the pumping speed and/or the quantity of purge gas.

Traceability can be improved by associating a bar code or infrared identification with each transport pod 1. Thus, the figure shows a bar code 57 on the peripheral wall of the transport pod 1. This makes it possible to avoid any risk of cross contamination between different process chambers or pieces of equipment 9.

It will be understood that the functions given to the interface 17 can be relatively numerous. In order to manage cycles of conditioning transport pods 1, it is advantageous to provide an automation, based on the controller 56, serving to control the pumping means, the operation of the doors, the flat article handlers, the purge device 51, and the locking means.

The apparatus of the invention can be used as means for bringing the transport pod 1 to a suitable pressure, either to a vacuum or to some other pressure. To do this, the atmosphere inside the transport pod 1 is a priori at atmospheric pressure. The interface is also put to atmospheric pressure, and the space inside the pod is put into communication with the space inside the interface. Thereafter, the interface pump means and the purge device 51 serve to condition the transport pod 1 and the interface 17, bringing them to the appropriate pressure, while avoiding turbulence, and moisture condensing or crystallizing.

Figure 14:
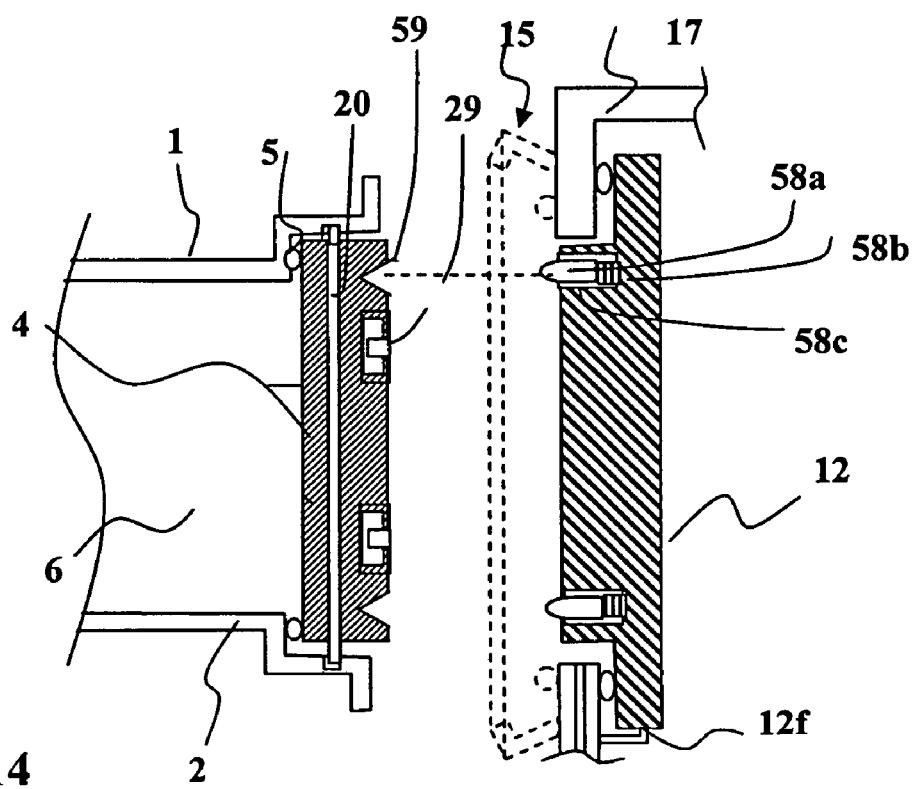
FIG. 14 is a diagrammatic plan view in section of a particular embodiment of the invention.

FIG. 14 is a plan view of the apparatus of the invention in a particular embodiment that includes centering means. To overcome initial off-centering between the pod door 4 and the pod 1, it is necessary to maintain the pod door 4 and the interface door 12 parallel and centered while they are in the coupled-together state. For this purpose, centering means 58 are placed in the interface door 12 and corresponding centering means 59 are placed in the pod door 4 for the purpose of holding and guiding the pod door 4 towards the interface door 12 in a centered manner when they are in the coupled state.

The centering means 58 provided in the interface door 12 preferably comprise two assemblies, each comprising a round-headed peg 58a and a spring 58b received in a housing 58c in the interface door 12 for this purpose. The housing 56c enables the peg to be guided along an axis. The spring 58b is disposed at the base of the peg 58a inside the housing 58c. The centering means 58 of the interface door 12 are preferably situated close to the detachable coupling means 29 and outside them. This disposition provides better control over keeping the doors 4 and 12 mutually parallel.

The detachable coupling means 29 are provided to be wide enough so as to keep the two doors 4 and 12 parallel vertically. The centering means 58 then co-operate with the detachable coupling means 29 to hold the interface door 12 and the pod door 4 parallel in the coupled-together state.

The centering means 59 provided in the pod door 4 preferably comprise two housings corresponding to the centering means 58 of the interface door 12. These housing are adapted to receive the pegs 58a of the centering means 58 of the interface door 12. These housings are preferably conically shaped so as to receive and block the heads of the pegs 58a of the interface door 12.

When the doors 4 and 12 are coupled together, at the moment when the pusher means 12f are released, the front sealing means 5 of the pod door 4 and the front sealing means 13 of the interface door 12 decompresses. The springs 58b provided in the centering means 58 of the interface door 12 release their tension applying force to the pegs 58a. The pegs 58a are guided by the centering means 59 provided in the pod door 4 so as to slide substantially towards the centers of the cones if there is any off-centering. Simultaneously, the decompression of the sealing means 5 causes the pod door 4 to move back and the detachable coupling means 29 come into contact with the insides of their housings in the pod door 4.

The stiffness of the spring 58*b* of the centering means 58 provided in the interface door 12 is selected in such a manner that the force exerted on the pegs 58*a* is greater than the friction force of the detachable coupling means 29 in their housings. The detachable coupling means 29 can then slide in their housings to accommodate the movement of the heads of the pegs 58*a*. The pod door 4 is thus readjusted into its centered position.

In this way, the centering means 58, 59 enable the pod door 4 to be guided sideways and vertically so that the two doors 4 and 12 are accurately centered and held parallel relative to each other.

In the above description and in the drawings, the connection pumping means 22-28, 56 and their optional application to conditioning the interface 17 and/or the transport pod 1 are presented in association with the door actuator means 14 and the elastically compressible sealing means 5. Nevertheless, in the invention, it is possible and advantageous to provide for said connection pumping means and that application to be capable of being used in independent manner.

The present invention is not limited to the embodiments described explicitly, but includes any variants and generalizations that are within the competence of the person skilled in the art.

What is claimed is:

1. An apparatus for transporting flat articles, the apparatus comprising:
   transport pods, each having:
      an internal cavity, structured to withstand an external atmospheric pressure in a presence of a vacuum,
      a leakproof peripheral wall including an inlet/outlet opening,
      a pod door to close the inlet/outlet opening,
      pod door locking means for selectively locking and unlocking the pod door in a closed position in which the inlet/outlet opening is closed, and
      pod door front sealing means, associated with the pod door, held in place by the pod door locking means when the pod door is in a locked closed position, the pod door front sealing means being elastically compressible and arranged to be held elastically compressed by the pod door,
   an interface, comprising:
      an article-passing opening,
      an interface door to close the article-passing opening, and
      interface door front sealing means, associated with the interface door;
   peripheral sealing means for isolating from an external atmosphere a coupling zone between the transport pod and the equipment interface around the article-passing opening and the inlet/outlet opening;
   door actuator means comprising:
      first actuator means disposed in the interface for displacing the pod and interface doors between the closed position and an open position which is offset toward an interior of the interface; and
      second actuator means, disposed in the interface and distinct from the first actuator means, for applying an axial thrust of sufficient strength against the pod door toward an interior of the transport pod to compress the pod door front sealing means beyond compression provided by the pod door locking means.

2. The apparatus according to claim 1, wherein the door actuator means is adapted:
   during locking of the pod door, to apply said axial thrust of sufficient strength to the pod door, to actuate the pod door locking means to lock the pod door, and to release the axial thrust; and
   during unlocking of the pod door, to apply said axial thrust of sufficient strength to the pod door, to actuate the locking means to unlock the pod door, and to release said axial thrust.

3. The apparatus according to claim 1, further comprising:
   detachable coupling means provided in the pod door and in the interface door, under the control of the door actuator means for reversibly securing the pod door against the interface door so that in a coupled state the pod door moves as a unit with the interface door between the closed position and the open position.

4. The apparatus according to claim 3, wherein:
   the interface door front sealing means are elastically compressible; and
   in the coupled state, the axial thrust of sufficient strength simultaneously compresses the interface door front sealing means and the pod door front sealing means.

5. The apparatus according to claim 3, wherein the door actuator means serves to move the pod door between the open and the closed position.

6. The apparatus according to claim 3, further comprising:
   retaining means for securing the transport pod reversibly against a wall surrounding the article-passing opening; and
   interface front sealing means for providing, between the transport pod and the wall surrounding the article-passing opening, sealing against the external atmosphere around the inlet/outlet opening and the article-passing opening when the transport pod is secured against said wall.

7. The apparatus according to claim 6, further comprising:
   connection pumping means for pumping out a peripheral volume of gas that is held captive in an inter-gasket zone between the pod door, the interface door, the pod door front sealing means, the interface door front sealing means, and the interface front sealing means, when the transport pod is secured against the wall of the interface and the pod and interface doors are in the closed position.

8. The apparatus according to claim 7, wherein, in the coupled state, an external face of the pod door presses directly against an external face of the interface door, and covers the external face of the interface door without clearance and without overhang.

9. The apparatus according to claim 7, wherein the connection pumping means is adapted to establish in the peripheral volume a gas pressure that is substantially equal to the pressure inside the transport pod when the transport pod is secured against the interface, and the pod door and the interface door are in the closed position.

10. The apparatus according to claim 7, wherein the connection pumping means is adapted to establish in the interface a gas pressure that is substantially equal to the pressure in the transport pod when the transport pod is secured against the interface, and the pod door, the interface door and the equipment door are in the closed position.

11. The apparatus according to claim 7, wherein the connection pumping means is adapted to establish selectively, in the interface and in the transport pod, when the pod door and the interface door are open and the equipment door is closed, a gas pressure that is substantially equal to one of the pressure in the piece of equipment, or a pressure desired in the transport pod.

12. The apparatus according to claim 7, wherein the connection pumping means comprises:
   a connection pumping duct having an inlet orifice communicating with the peripheral volume between the interface front sealing means and the interface door front sealing means, and
   a vacuum pump device connected to the connection pumping duct via an outlet.

13. The apparatus according to claim 12, wherein the connection pumping means further comprises:
   a connection pumping control valve interposed in the connection pumping duct.

14. The apparatus according to claim 13, wherein the connection pumping means further comprises:
   an interface pumping duct to connect the vacuum pump device to an inside space of the interface, and
   an interface pumping control valve interposed in said interface pumping duct.

15. The apparatus according to claim 7, wherein the connection pumping means is adapted to establish, in the peripheral volume, a pressure substantially equal to the surrounding pressure outside the apparatus.

16. The apparatus according to claim 15, wherein the connection pumping means further comprises:
   a balancing duct, and
   a balancing valve that connects the peripheral volume with the outside of the apparatus.

17. The apparatus according to claim 3, wherein at least one centering means is provided in at least one of the interface door or the pod door for guiding the pod door towards the interface door, and holding the interface and pod doors in alignment when the interface and pod doors are coupled together.

18. The apparatus according to claim 17, wherein at least one centering means is provided in the interface door comprising a spherically-headed peg and a spring housed in a guide-forming housing in the interface door and at least one centering means is provided in the pod door having a housing suitable for receiving a corresponding centering means of the interface door.

19. The apparatus according to claim 1, wherein the door actuator means moves the pod and interface doors along two part strokes, comprising:
   an axial part stroke between the closed position and a position that is axially set back towards the inside of the interface, and
   a transverse part stroke in a vertical direction between the axially setback position and a laterally retracted position that releases a passage for the flat articles between the transport pod and the piece of equipment.

20. The apparatus according to claim 1, wherein the door actuator means is provided in the interface that is fitted to the inlet of the piece of equipment.

21. The apparatus according to claim 1, wherein the second actuator means comprises:
   a semicylindrical vertical shaft mounted laterally in the interface, and having a corner that is adapted to press against an involute-shaped cam provided in a side edge of the interface door when the shaft turns counterclockwise.

* * * * *